(12) United States Patent
Krauss et al.

(10) Patent No.: US 8,836,359 B2
(45) Date of Patent: Sep. 16, 2014

(54) CAPACITIVE INPUT TEST METHOD

(75) Inventors: Mathias Krauss, Dresden (DE); Sam Koblenski, Madison, WI (US)

(73) Assignee: Zentrum Mikroelektronic Dresden AG, Dresden (DE)

( * ) Notice: Subject to any disclaimer, the term of this patent is extended or adjusted under 35 U.S.C. 154(b) by 452 days.

(21) Appl. No.: 13/144,036

(22) PCT Filed: Jan. 12, 2010

(86) PCT No.: PCT/US2010/020709
§ 371 (c)(1),
(2), (4) Date: Sep. 26, 2011

(87) PCT Pub. No.: WO2010/081125
PCT Pub. Date: Jul. 15, 2010

(65) Prior Publication Data
US 2012/0098557 A1    Apr. 26, 2012

Related U.S. Application Data

(60) Provisional application No. 61/143,846, filed on Jan. 12, 2009.

(51) Int. Cl.
G01R 31/3187 (2006.01)
H03M 1/10 (2006.01)
H03M 1/12 (2006.01)

(52) U.S. Cl.
CPC ............... *H03M 1/109* (2013.01); *H03M 1/12* (2013.01)
USPC ...................................................... 324/750.3

(58) Field of Classification Search
CPC ....... G01R 27/2605; H03M 3/43; H04B 5/02; H04M 2250/22; G01D 5/24; G06F 3/023; G06F 1/3206; G06F 2203/04104; G06F 3/0416; G06F 3/044; G01L 9/12; G01N 27/22
See application file for complete search history.

(56) References Cited

U.S. PATENT DOCUMENTS 4,399,426 A * 8/1983 Tan ................................ 341/120
5,684,487 A * 11/1997 Timko ........................... 341/172
(Continued)

FOREIGN PATENT DOCUMENTS

EP          0816818 A2    1/1998

OTHER PUBLICATIONS

Kung Joseph T et al; "Digital readout technique for capacitive sensor applications," IEEE Journal of Solid-State Circuits 1988, vol. 23, No. 4, Aug. 1988, pp. 972-977.

(Continued)

*Primary Examiner* — Vinh Nguyen
(74) *Attorney, Agent, or Firm* — Kevin P. Radigan, Esq.; Heslin Rothenberg Farley & Mesiti P.C.

(57) ABSTRACT le;.5qMethod and system are provided for evaluating linearity of a capacitive-to-digital converter (CDC) of a capacitive sensor integrated circuit chip. The evaluating employs multiple test capacitors, which may be on-chip with the CDC, and includes: obtaining capacitance values for the multiple test capacitors and parasitic capacitances of a first input A and a second input B to the capacitive-to-digital converter; applying the multiple test capacitors in multiple permutations to the first input A and the second input B, and for each of at least some permutations, determining an error between an expected output of the CDC using the obtained capacitance values and an actual measured output of the CDC; and determining linearity error for the CDC using the determined errors for the permutations of applying the multiple test capacitors to the first input A and the second input B of the CDC.

14 Claims, 5 Drawing Sheets

(56) References Cited

U.S. PATENT DOCUMENTS 6,144,331 A * 11/2000 Jiang .............................. 341/172
7,236,113 B1   6/2007 Wang
8,410,969 B2 *  4/2013 Krauss et al. ................. 341/172

OTHER PUBLICATIONS

Analog Devices: "24-bit capacitance-to-Digital Converter with temperature Sensor (AD7745/AD7746" product data sheet; Jan. 1, 2005.
International Search Report for PCT/US2010/020709 dated May 28, 2010.

* cited by examiner

| CA | CB | OUTPUT FORMULA | CALCULATED | MEASUREMENT | ERROR |
|---|---|---|---|---|---|
| $C_a$ | $C_1+C_2+C_4+C_b$ | $C_a/C_{SUM}*1024$ | 121.250 | 120 | 0.12% |
| $C_a+C_1$ | $C_2+C_4+C_b$ | $C_a+C_1/C_{SUM}*1024$ | 248.750 | 249 | -0.02% |
| $C_a+C_2$ | $C_1+C_4+C_b$ | $C_a+C_2/C_{SUM}*1024$ | 349.750 | 350 | -0.02% |
| $C_a+C_1+C_2$ | $C_4+C_b$ | $C_a+C_1+C_2/C_{SUM}*1024$ | 477.250 | 478 | -0.07% |
| $C_a+C_4$ | $C_1+C_2+C_b$ | $C_a+C_4/C_{SUM}*1024$ | 552.750 | 554 | -0.12% |
| $C_a+C_1+C_4$ | $C_2+C_b$ | $C_a+C_1+C_4/C_{SUM}*1024$ | 680.250 | 680 | 0.02% |
| $C_a+C_2+C_4$ | $C_1+C_b$ | $C_a+C_2+C_4/C_{SUM}*1024$ | 781.250 | 781 | 0.02% |
| $C_a+C_1+C_2+C_4$ | $C_b$ | $C_a+C_1+C_2+C_4/C_{SUM}*1024$ | 908.750 | 908 | 0.07% |

FIG. 3

CAPACITIVE INPUT TEST METHOD

CROSS-REFERENCE TO RELATED APPLICATION

This application is a national stage filing under section 371 of International Application No. PCT/US2010/020709 filed on Jan. 12, 2010, and published in English on Jul. 15, 2010 as WO 2010/081125 and claims the benefit of U.S. Provisional Application No. 61/143,846, filed Jan. 12, 2009, the entire disclosure of these applications being hereby incorporated herein by reference in their entirety.

BACKGROUND

The present invention relates in general to testing of electronic devices such as Complementary Metal-Oxide-Semiconductor (CMOS) devices, and more particularly, to a capacitive input test method and system for accurate testing of capacitance-to-digital conversion of a capacitive sensor signal.

Capacitive sensor signal-conditioning integrated circuits, such as the cLite™ capacitive sensor signal conditioner (or cLite™ ASSP (Application Specific Standard Product)) available from Zentrum Mikroelektronik Dresden (ZMD) AG of Dresden Germany, comprise a capacitive-to-digital converter and are able to convert a capacitance within a selectable range (for example, 2-260 pF in the case of the cLite™ signal conditioner), to a corresponding digital value. Advantageously, the cLite™ signal conditioner currently provides a 14-bit resolution and very high accuracy over wide ranges of capacitances and temperatures, and can be used as input for microcontrollers or other switch applications.

Capacitive sensors are widely used in many MEMS sensing elements, such as pressure sensors for hydraulic control systems, humidity sensors and liquid level gauges. Such sensors do not touch or make direct contact with the system or device being sensed, and thus the sensors are advantageous for industrial linear and angular position sensors and contactless potentiometers, even under harsh or explosive environmental conditions.

The capacitive-to-digital converter (CDC) must be defect-free in production, and it is desirable to verify this during the production process. However, testing of a capacitive-to-digital converter is difficult since existing automatic test equipment (ATE) can not directly source or measure capacitance to facilitate the testing operation.

BRIEF SUMMARY

In general, range selection in differential/single-ended modes can be tested using fixed capacitors on the external test circuit that are switched on to the inputs of the capacitive-to-digital converter using analog multiplexers designed for low throughput capacitance. Precision capacitors can be used to attain a reasonable accuracy for these absolute measurements. However, a difficulty arises when attempting to measure, even with very precise capacitors, the linearity of the capacitive-to-digital converter. Thus, disclosed herein is a capacitive input test method for CMOS integrated circuits to test linearity of capacitance-to-digital conversion of a capacitive sensor signal.

In one aspect, the shortcomings of the prior art are overcome and additional advantages are provided through the provision of a method of evaluating linearity of a capacitive-to-digital converter of a capacitive sensor integrated circuit chip. The method includes: providing multiple test capacitors; obtaining capacitance values of the multiple test capacitors and parasitic capacitance of a first input A and a second input B to the capacitive-to-digital converter; applying the multiple test capacitors in multiple permutations to the first input A and the second input B of the capacitive-to-digital converter, and for each of at least some permutations, determining an error between an expected output of the capacitive-to-digital converter using the obtained capacitance values and an actual measured output of the capacitive-to-digital converter; and determining linearity error for the capacitive-to-digital converter using the determined errors for the at least some multiple permutations of applying the multiple test capacitors to the first input A and the second input B of the capacitive-to-digital converter.

In a further aspect, a testing system for evaluating linearity of a capacitive-to-digital converter is provided. The testing system includes a processor to estimate capacitance values of multiple test capacitors to be selectively applied to a first input A and a second input B to the capacitive-to-digital converter, and parasitic capacitance of the first input A and the second input B to the capacitive-to-digital converter. The processor further applies the multiple test capacitors in multiple permutations to the first input A and the second input B of the capacitive-to-digital converter, and for each of at least some permutations, determines an error between an expected output of the capacitive-to-digital converter using the obtained capacitance values and an actual measured output of the capacitive-to-digital converter. The processor further determines linearity error for the capacitive-to-digital converter using the determined errors for the at least some permutations of applying the multiple test capacitors to the first input A and the second input B of the capacitive-to-digital converter.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The forgoing and other objects, features, and advantages of the invention are apparent from the following detailed descriptions taken in conjunction with the accompanying drawings in which:

FIG. 3 depicts an example set of permutations, output formulas, calculations, measurements and error values employing three on-chip test capacitors in testing linearity of a capacitive-to-digital converter, in accordance with an aspect of the present invention;

DETAILED DESCRIPTION

Figure 1:
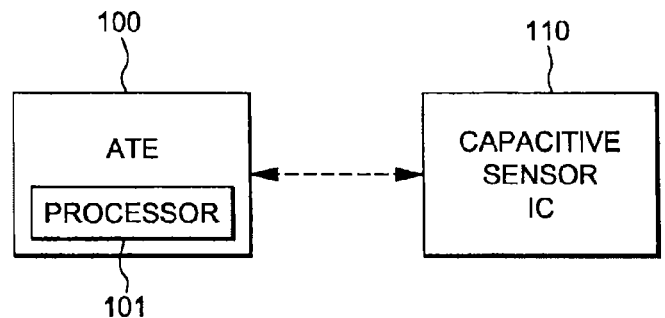
FIG. 1 is a block diagram of an automated test equipment (ATE) system coupled to a capacitive sensor integrated circuit (IC) chip for testing thereof, in accordance with an aspect of the present invention.

FIG. 1 depicts an automated test equipment (ATE) system 100 coupled to a capacitive sensor integrated circuit (IC) chip 110 to be tested, in accordance with one or more aspects of the present invention. As illustrated, ATE system 100 includes a processor 101 which may, in one embodiment, implement one or more processing steps described herein below. Alternatively, one or more of the processing steps described herein may be implemented by a processor (not shown) embedded within capacitive sensor IC chip 110.

Figure 2A:
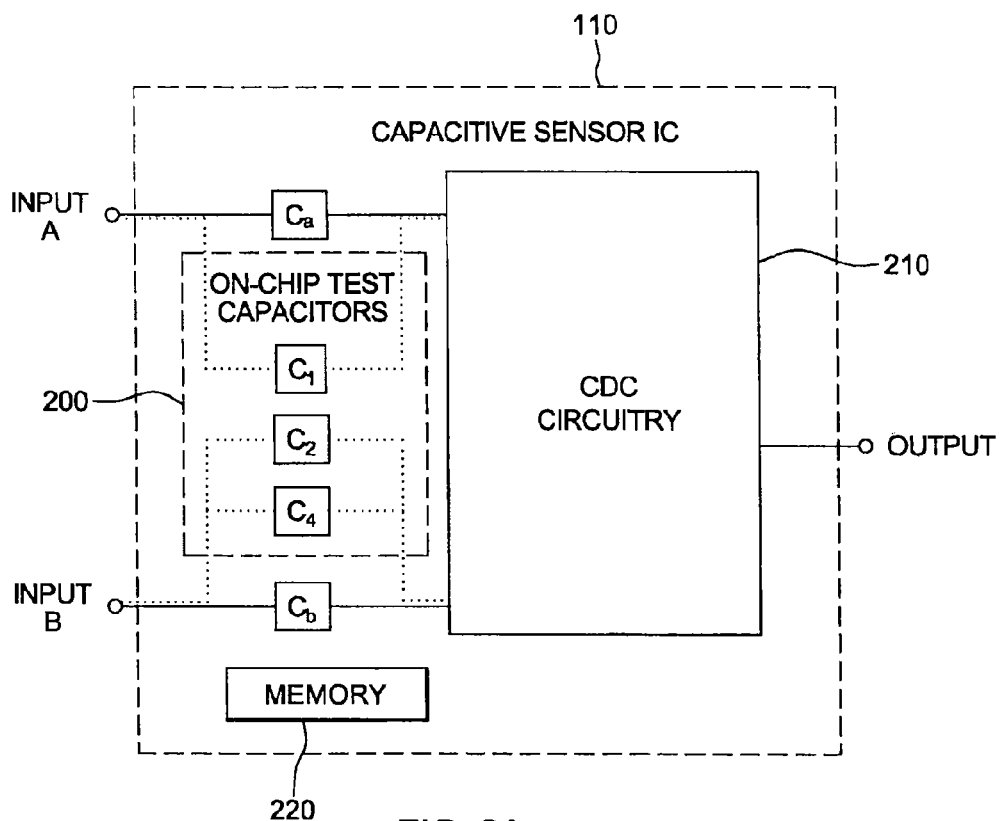
FIG. 2A is a block diagram of one embodiment of a capacitive sensor integrated circuit (IC) chip incorporating on-chip test capacitors for facilitating evaluating linearity of its capacitive-to-digital converter (CDC) circuitry, in accordance with an aspect of the present invention.

As illustrated in FIG. 2, linearity measurement is facilitated, in one embodiment, by a set of on-chip test capacitors 200 disposed to be selectively switched (during chip testing) in parallel with either a first input A or a second input B of the capacitance-to-digital converter (CDC) circuitry 210. In the example illustrated in FIG. 2A, an on-chip capacitor $C_1$ is switched in parallel with parasitic capacitance $C_a$ of first input A, and second and third on-chip capacitors $C_2$, $C_4$ are switched in parallel with parasitic capacitance $C_b$ of second input B of capacitive-to-digital converter circuitry 210. By way of example, linearity measurement can be facilitated by employing a set of capacitors that double in value from one test capacitor to the next. Thus, the three capacitors illustrated in FIG. 2A might comprise values of, for example, $C_1$ 1 pF, $C_2$ 2 pF and $C_4$ 4 pF (or, alternatively, $C_1$, 1.5 pF, $C_2$ 3 pF, $C_4$ 6 pF, or $C_1$ 2 pF, $C_2$ 4 pF, $C_4$ 8 pF, etc.). Due to parasitic variations, the actual capacitance values will vary from one implementation of a capacitor to the next, and thus, exact values can not be known. Note also that three test capacitors are sufficient (in one embodiment) for evaluating linearity of the CDC.

Memory 220 is also illustrated in FIG. 2A on-chip, that is, within capacitive sensor integrated circuit chip 110. This memory may comprise, in one example, an on-board, non-volatile EEPROM for storing calibration coefficients established as a result of evaluating linearity of the CDC circuitry. Thus, it is possible to calibrate the CDC circuitry to enhance the exactness of the signal conditioner, for example, the cLite™ ASSP conditioner noted above.

Figure 2B:
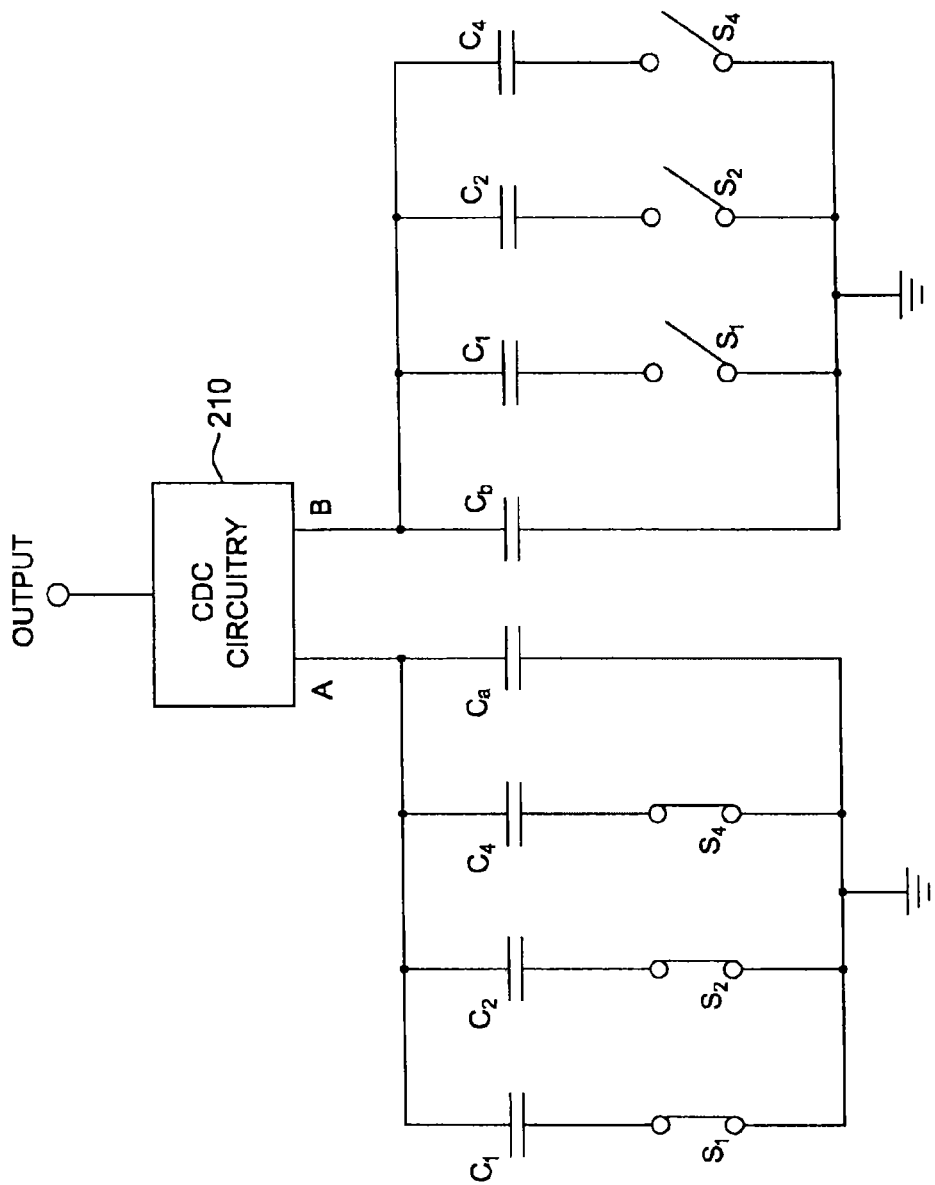
FIG. 2B conceptually illustrates application of multiple test capacitors to a first input A and second input B of a capacitive-to-digital converter, depicting one permutation of multiple possible permutations, in accordance with an aspect of the present invention.

To realize a best mode for the measurements described herein, the test capacitors are on-chip capacitors, that is, within the capacitive sensor integrated circuit chip containing the CDC circuitry being evaluated. This ensures short connect lines exist when selectively coupling the test capacitors in parallel with first input A or second input B of the CDC, and thus, ensures absolute low parasitic capacitances associated with coupling the test capacitors in parallel with either first input A or second input B. FIG. 2B conceptually illustrates switches to facilitate application of the multiple test capacitors to first input A or second input B of the capacitive-to-digital converter. In this depiction, capacitors $C_1$, $C_2$, $C_4$ are switched in parallel with parasitic capacitance $C_a$ (by way of example only), with second input B only having parasitic capacitance $C_b$.

If all combinations of capacitors $C_1$, $C_2$, & $C_4$, are applied to first input A and second input B, a set of equations results which can be solved to discover the relative values, along with the linearity error in the CDC. The test is performed with the differential mode of the CDC, and all three capacitors are connected to either input A or input B or a combination of input A and input B of the CDC. As noted, the inputs are assumed to have a parasitic capacitance, referred to herein as $C_a$ and $C_b$, for inputs A and B, respectively.

The on-chip capacitors are labeled $C_1$, $C_2$, $C_4$ and the total capacitance which is connected to the inputs A and B will be $C_A$ and $C_B$ (see FIG. 3). Each $C_A$ and $C_B$ value is a result of a particular combination of the capacitors $C_1$, $C_2$, $C_4$, $C_a$ and $C_b$. These several combinations of capacities can be performed via switches connected between capacitors $C_1$, $C_2$, $C_4$ and ground or another mass or common contact. The parasitic capacitors can not be switched off since these capacities exist permanently. FIG. 2B shows a logical illustration of the on-chip capacitors with respective switches $S_1$, $S_2$, $S_4$ in the on-state in parallel with input A and in the off-state in parallel with input B. In the illustrated on-state of the switches $S_1$, $S_2$, $S_4$, the resulting capacitance $C_A$ on input A will be $C_1+C_2+C_4+C_a$, while capacitance $C_B$ on input B will be $C_b$, and so on, to realize all combinations illustrated in the data set of FIG. 3 for $C_A$ and $C_B$. Note again that in each permutation, capacitors $C_1$, $C_2$, $C_4$ are switched either to input A or to input B or to a combination thereof.

The table of FIG. 3 shows an example set of measurements for all combinations of the on-chip test capacitors, the resulting output formulas and values for the measurements and errors. These combinations of test capacitors can be implemented on-chip with a simple logic circuitry comprising switches bridging one or more of the on-chip capacitors or not. $C_{SUM}$ refers to the sum of $C_a+C_1+C_2+C_4+C_b$.

A target is to drive the sum-of-squared errors to zero (or close to zero) by iteratively searching for the unknown variables $C_a$, $C_1$, $C_2$, $C_4$, $C_b$.

The initial guess can be something like the capacitors' rated capacitances, for example, 1 pF for $C_a$, 1 pF for $C_1$, 2 pF for $C_2$, 4 pF for $C_4$ and 1 pF for $C_b$. The solution that results in the errors according the scheme of FIG. 3 and a sum-of-squared errors of 4.29 e−6 is as follows:

| $C_a$ | $C_1$ | $C_2$ | $C_4$ | $C_b$ |
|---|---|---|---|---|
| 1.09892 | 1.15556 | 2.07095 | 3.91078 | 1.04454 |

Figure 4:
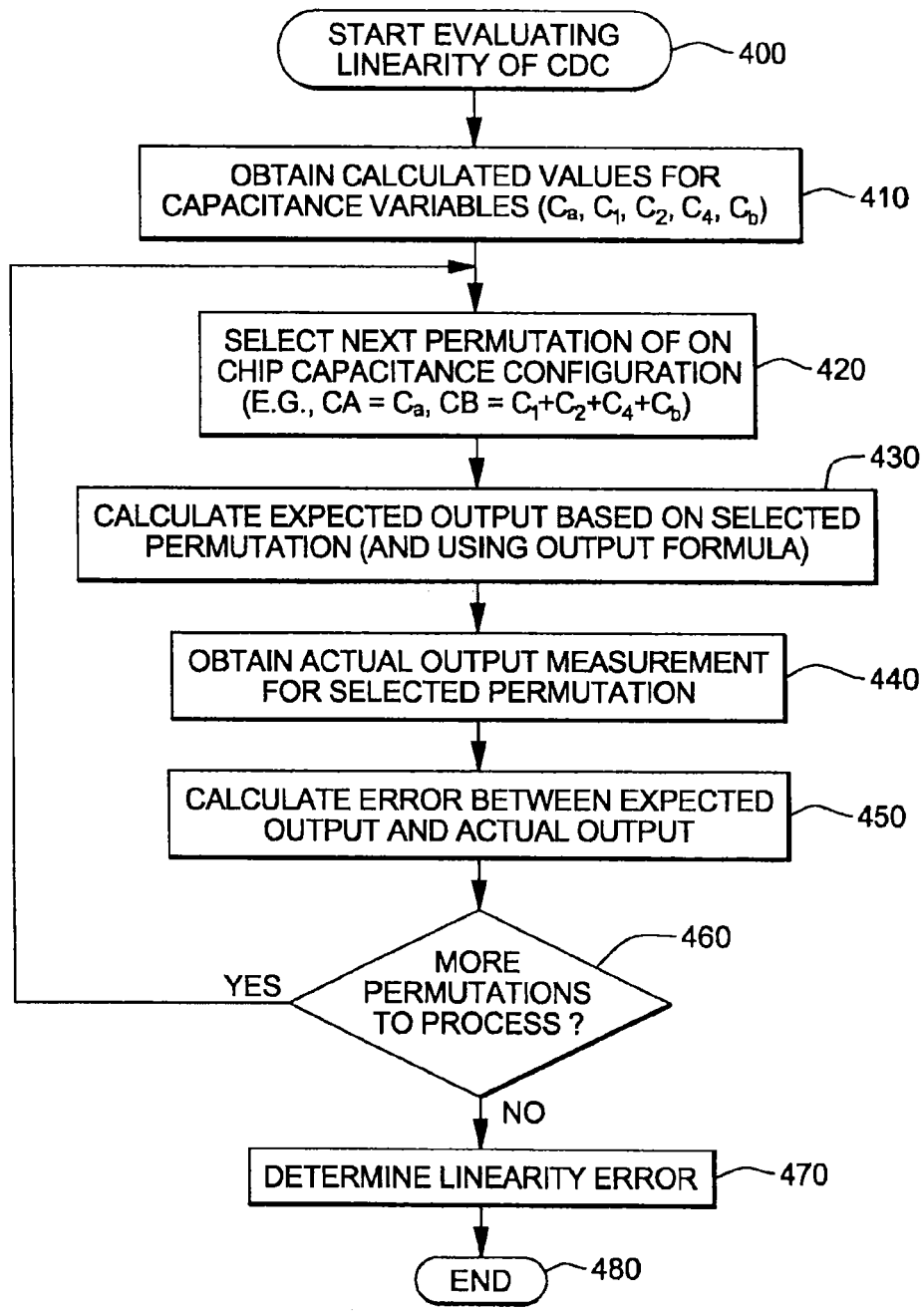
FIG. 4 is a flowchart of one embodiment of processing for evaluating linearity of a capacitive-to-digital converter, in accordance with an aspect of the present invention.

FIG. 4 illustrates one embodiment of processing to arrive at the data set of FIG. 3. Processing starts evaluating linearity of a CDC 400 by obtaining values for capacitance variables $C_a$, $C_1$, $C_2$, $C_4$, $C_b$ 410. As one example, values for capacitance variables $C_a$, $C_1$, $C_2$, $C_4$, $C_b$ may be obtained by employing an initial estimate of the capacitance values, and then driving the sum-of-squared errors to zero by iteratively searching for the capacitance variables.

Continuing with the processing of FIG. 4, a next permutation of on-chip capacitance configuration is selected, for example, from the data set illustrated in FIG. 3 420. The expected output is calculated based on the selected permutation and using the respective output formula 430. An actual output measurement for the selected permutation is then obtain 440 and processing calculates the error between the expected output and the actual output 450. A determination is made whether more permutations are to be processed 460, and if so, processing returns to select a next permutation of on-chip capacitance configurations, for example, from the data set of FIG. 3. If all permutations have been processed, then processing determines the linearity error 470, before ending 480.

Figure 5:
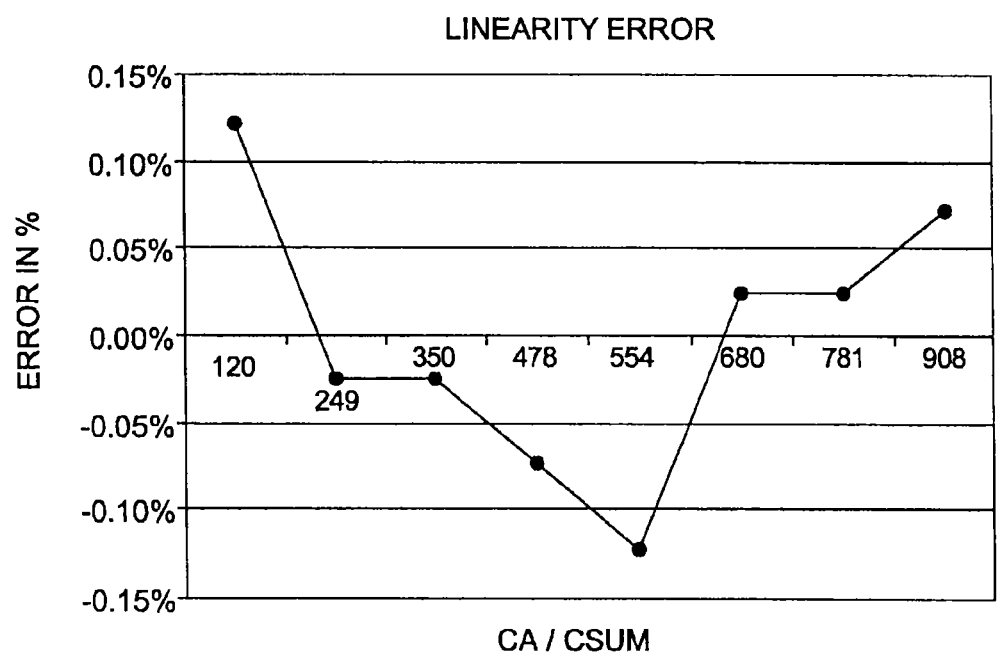
FIG. 5 graphically illustrates a linearity error curve plotting the determined errors of the data set of FIG. 3, in accordance with an aspect of the present inventions.

The linearity error is given by the maximum absolute error, which in this example is 0.12%. The plot in FIG. 5 shows the linearity error curve for this set of measurements.

An interesting point about this test method is that there are actually an infinite number of solutions for the unknown variables, but all solutions only differ by an offset and gain factor. This peculiarity results because the offset and gain terms of the capacitor values do not affect the linearity of the CDC.

The test method is in fact, finding the on of the set of best-fit straight line solutions for the linearity error, given the constraint equations. The constraint equations are necessary to restrict the solver's ability to compensate for the CDC's linearity error in the solution and all of the solutions that result in minimizing the error give the same error curve.

As a result, this test method is an efficient and effective way of measuring the CDC's linearity error by adding only a few small on-chip capacitors to the CDC design. And such on-chip capacitors can be easily assembled with well known technology.

Aspects of the present invention are described herein with reference to a flowchart illustration and/or block diagrams of methods, apparatus (systems) and computer program products according to embodiments of the invention. It will be understood that each block of the flowchart illustration and/or block diagrams, and combinations of blocks in the flowchart illustration and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention.

Although embodiments have been depicted and described in detail herein, it will be apparent to those skilled in the relevant art that various modifications, additions, substitutions and the like can be made without departing from the spirit of the invention and that these are therefore considered to be within the scope of the invention as defined by the following claims.

What is claimed is:

1. A method of evaluating linearity of a capacitive-to-digital converter of a capacitive sensor integrated circuit chip, the method comprising:
    providing multiple test capacitors;
    measuring capacitance values of the multiple test capacitors and parasitic capacitance of a first input A and a second input B to the capacitive-to-digital converter;
    applying the multiple test capacitors in multiple permutations to the first input A and the second input B of the capacitive-to-digital converter, and for each of at least some permutations, determining an error between an expected output of the capacitive-to-digital converter using the capacitance values and an actual measured output of the capacitive-to-digital converter, the error comprising a difference between the expected output and the actual measured output; and
    determining linearity error for the capacitive-to-digital converter using the determined errors for the at least some permutations of applying the multiple test capacitors to the first input A and the second input B of the capacitive-to-digital converter.

2. The method of claim 1, wherein the providing comprises providing the multiple test capacitors within the capacitive sensor integrated circuit chip.

3. The method of claim 1, wherein capacitance of the multiple test capacitors approximately doubles from one test capacitor to the next.

4. The method of claim 1, wherein the providing comprises providing e test capacitors within the capacitive sensor integrated circuit chip.

5. The method of claim 1, wherein the applying comprises solving a set of equations for capacitance values for the multiple test capacitors and parasitic capacitances of the first input A and second input B, the set of equations minimizing a sum-of-squared errors for the at least some permutations.

6. The method of claim 1, wherein determining the linearity error comprises determining a maximum absolute value of the determined errors for the at least some permutations of applying the multiple test capacitors to the first input A and the second input B of the capacitive-to-digital converter.

7. The method of claim 1, further comprising plotting a best-fit linearity error curve using the determined errors for the at least some permutations of applying the multiple test capacitors to the first input A and the second input B of the capacitive-to-digital converter.

8. The method of claim 1, wherein each permutation of the multiple permutations employs each test capacitor of the multiple test capacitors, and wherein the applying comprises for each permutation of the multiple permutations, providing each test capacitor of the multiple test capacitors in parallel with one of the first input A or the second input B of the capacitive-to-digital converter.

9. A testing system for evaluating linearity of a capacitive-to-digital converter, the testing system comprising:
    a processor to measure capacitance values of multiple test capacitors to be selectively applied to a first input A and a second input B of the capacitive-to-digital converter and parasitic capacitance of the first input A and the second input B of the capacitor-to-digital converter;
    the processor applying the multiple test capacitors in multiple permutations to the first input A and the second input B of the capacitive-to-digital converter, and for each of at least some permutations, determining an error between an expected output of the capacitive-to-digital converter using the estimated capacitance values and an actual measured output of the capacitive-to-digital converter, the error comprising a difference between the expected output and the actual measured output; and
    the processor determining linearity error for the capacitive-to-digital converter using the determined errors for the at least some permutations of applying the multiple test capacitors to the first input A and the second input B of the capacitive-to-digital converter.

10. The testing system of claim 9, wherein the multiple test capacitors and the capacitive-to-digital converter are both disposed within a capacitive sensor integrated circuit chip.

11. The testing system of claim 9, wherein the multiple test capacitors are three test capacitors, the three test capacitors and the capacitive-to-digital converter being disposed within a capacitive sensor integrated circuit chip.

12. The testing system of claim 9, wherein the processor measures the capacitance values by solving a set of equations for capacitance values for the multiple test capacitors and parasitic capacitances of the first input A and second input B, the set of equations minimizing a sum-of squared errors for the at least some permutations.

13. The testing system of claim 9, wherein the processor determines linearity error by ascertaining a maximum absolute value of the determined errors for the at least some permutations of applying the multiple test capacitors to the first input A and the second input B of the capacitive-to-digital converter.

14. The testing method of claim 9, wherein the processor plots a best-fit linearity error curve using the determined errors for the at least some permutations of applying the multiple test capacitors to the first input A and the second input B of the capacitive-to-digital converter.

* * * * *

UNITED STATES PATENT AND TRADEMARK OFFICE
CERTIFICATE OF CORRECTION

PATENT NO.         : 8,836,359 B2                                            Page 1 of 1
APPLICATION NO.    : 13/144036
DATED              : September 16, 2014
INVENTOR(S)        : Krauss et al.

It is certified that error appears in the above-identified patent and that said Letters Patent is hereby corrected as shown below:

On the title page in the Abstract item (57), First Sentence: Delete "le;.5q"

Signed and Sealed this
Twenty-third Day of December, 2014

Michelle K. Lee
*Deputy Director of the United States Patent and Trademark Office*